United States Patent
Webb et al.

(10) Patent No.: US 6,884,335 B2
(45) Date of Patent: Apr. 26, 2005

(54) ELECTROPLATING USING DC CURRENT INTERRUPTION AND VARIABLE ROTATION RATE

(75) Inventors: Eric G. Webb, Salem, OR (US); Jonathan D. Reid, Sherwood, OR (US); John H. Sukamto, Tualatin, OR (US); Sesha Varadarajan, Wilsonville, OR (US); Margolita M. Pollack, Beaverton, OR (US); Bryan L. Buckalew, Tualatin, OR (US); Tariq Majid, Tualatin, OR (US)

(73) Assignee: Novellus Systems, Inc., San Jose, CA (US)

( * ) Notice: Subject to any disclaimer, the term of this patent is extended or adjusted under 35 U.S.C. 154(b) by 154 days.

(21) Appl. No.: 10/441,607

(22) Filed: May 20, 2003

(65) Prior Publication Data
US 2004/0231996 A1 Nov. 25, 2004

(51) Int. Cl.⁷ .............................. C25D 5/18; C25D 7/12
(52) U.S. Cl. ...................... 205/104; 205/143; 205/157; 205/261; 205/291; 428/687; 428/935
(58) Field of Search .................................. 205/104, 143, 205/157, 261, 291; 428/687, 935

(56) References Cited

U.S. PATENT DOCUMENTS

| | | | |
|---|---|---|---|
| 5,972,192 A | 10/1999 | Dubin et al. | |
| 6,074,544 A | 6/2000 | Reid et al. | |
| 6,261,433 B1 | 7/2001 | Landau | |
| 6,344,129 B1 | 2/2002 | Rodbell et al. | |
| 6,432,821 B1 | 8/2002 | Dubin et al. | |
| 6,440,289 B1 | 8/2002 | Woo et al. | |
| 2001/0045360 A1 | 11/2001 | Omasa | |
| 2002/0056645 A1 | 5/2002 | Taylor et al. | |
| 2002/0066673 A1 | 6/2002 | Rodbell et al. | |

*Primary Examiner*—Robert R. Koehler
(74) *Attorney, Agent, or Firm*—Thomas Swenson

(57) ABSTRACT

A negative bias is applied to an integrated circuit wafer immersed in an electrolytic plating solution to generate a DC current. After about ten percent to sixty percent of the final layer thickness has formed in a first plating time, biasing is interrupted during short pauses during a second plating time to generate substantially zero DC current. The pauses are from about 2 milliseconds to 5 seconds long, and typically about 10 milliseconds to 500 milliseconds. Generally, about 2 pauses to 100 pauses are used, and typically about 3 pauses to 15 pauses. Generally, the DC current density during the second plating time is greater than the DC current density during the initial plating time. Typically, the integrated circuit wafer is rotated during electroplating. Preferably, the wafer is rotated at a slower rotation rate during the second plating time than during the first plating time.

57 Claims, 9 Drawing Sheets

ELECTROPLATING USING DC CURRENT INTERRUPTION AND VARIABLE ROTATION RATE

FIELD OF THE INVENTION

The present invention pertains to the field of electroplating of integrated circuit substrate wafers.

BACKGROUND OF THE INVENTION

Integrated circuits are formed on wafers by well-known processes and materials. These processes typically include the deposition of thin film layers by sputtering, metal-organic decomposition, chemical vapor deposition, plasma vapor deposition, and other techniques. These layers are processed by a variety of well-known etching technologies and subsequent deposition steps to provide a completed integrated circuit.

A crucial component of integrated circuits is the wiring or metallization layer that interconnects the individual circuits. Conventional metal deposition techniques include physical vapor deposition, e.g., sputtering and evaporation, and chemical vapor deposition techniques. Some integrated circuit manufacturers are investigating electrodeposition techniques to deposit primary conductor films on semiconductor substrates.

Wiring layers traditionally contained aluminum and a plurality of other metal layers that are compatible with the aluminum. In 1997, IBM introduced technology that facilitated a transition from aluminum to copper wiring layers. This technology has demanded corresponding changes in process architecture towards damascene and dual damascene architecture, as well as new process technologies.

Copper damascene circuits are produced by initially forming trenches and other embedded features in a wafer, as needed for circuit architecture. These trenches and embedded features are formed by conventional photolithographic processes in a nonconductive substrate, such as a silicon oxide. A barrier layer, e.g., of silicon nitride or tantalum, is deposited next. An initial seed or strike layer typically comprising copper and having a thickness of about 20 nanometers (nm) to 200 nm is then deposited by a conventional physical or vapor deposition technique. The seed layer is used as a base layer to conduct current for electroplating thicker films. Thinner seed layers are preferred so as to reduce overhang and closure of very small features with metal from the seed layer. The seed layer functions as the cathode of an electroplating cell. Electrical contacts to the wafer are normally made at its edge. Since the seed layer is usually very thin, there is a significant resistive drop between the points of contact at the edge of the wafer and the center of the wafer. This is referred to as the "terminal effect". When the system is operating in a regime in which the plating rate is determined by the magnitude of the current, the plating rate is greater at the edge of the wafer than at the center of the wafer. As a result, the plated layer often has a concave dish-shaped profile initially. As the thickness of the copper layer increases during plating, the terminal effect diminishes and the plated layer is deposited at a more uniform rate. U.S. Pat. No. 6,074,544, issued Jun. 13, 2000 to Reid et al., which is hereby incorporated by reference, teaches a method of electroplating on a semiconductor wafer using a low current density initially to reduce resistance drop between the edge of the wafer and the center of the wafer, and then increasing the current density after the metal layer has reached a predetermined thickness.

Generally, in electroplating processes, the thickness profile of the deposited metal is controlled to be as uniform as possible. This uniform profile is advantageous in subsequent etchback or polish removal steps, as well as uniform void-free filling of the trench structures. Prior art electroplating techniques are susceptible to thickness irregularities. Factors contributing to these irregularities include the size and shape of the electroplating cell, electrolyte depletion effects, hot edge effects, and the terminal effect.

Regarding the trend towards larger diameter wafers, it is generally understood that the deposition rate, as measured by layer thickness, can be maintained by scaling total current through the electrochemical reactor in proportion to the increased surface area of the larger wafer. Thus, a 300 millimeter (mm) wafer requires 2.25 times more current than does a 200 mm wafer. Electroplating operations are preferably performed by using a clamshell-type wafer holder that contacts the wafer only at its outer radius. Due to this mechanical arrangement, the total resistance from the edge of the wafer to the center of the wafer is proportional to the radius. Nevertheless, with the higher applied current at the edge of the larger wafer, which is required to maintain the same current density for process uniformity, the total potential drop from the edge to the center of the wafer is greater for the larger diameter wafer. This circumstance leads to an increased rate of deposition that increases with radius where deposition is measured by layer thickness. While the problem of increasing deposition rate with radius exists for all wafers, it is exacerbated in the case of larger wafers.

The introduction of damascene metallization for copper interconnects has led to the development and modification of processes for 0.13 microns ($\mu$m) and smaller design rules. The implementation of new process flows has caused new device-killing defect formation, as well as nuisance defects, which interfere with the ability to identify accurately the device-killing defects. In copper damascene metallization, defects generally arise during the three main process sequences: deposition of barrier and seed layers; electrofill operations, including pre- and post-anneal; and chemical mechanical polishing (CMP). The ability to analyze and monitor defects on plating films requires the optimization of metrology. Measuring defects on copper deposits is difficult, in part, because the subtle variations in surface morphology are highly sensitive to process conditions. For example, the KLA-Tencor AIT II is an optical contrast apparatus that is particularly sensitive for measuring films thinner than 1 $\mu$m. Combined with a defect-review capability (e.g., optical microscope or SEM), the AIT II is useful for identifying defects. Measuring copper defects typically requires a trade-off of sensitivity to accommodate signal-to-noise ratios. False readings result from the high reflectivity of metal films, thereby reducing instrument sensitivity and causing inaccurately low defect counts.

Critical post-plating in-film killer defects in electroplated copper layers include pits, craters, and voids, which typically form during the electroplating process or during the post-plate anneal steps. Another type of defect are single isolated protrusions. Single isolated protrusions can usually be eliminated during CMP. Nevertheless, single isolated protrusions are nuisance defects because they hinder the identification of critical defects, such as pits. Therefore, the elimination of single isolated protrusion defects is important for accurate and reliable identification of critical defects.

DC electroplating tends to result in undesirable "hump" development over small features, for example, features less than one micron. Such humps may have a step height of, for example, more than 0.5 microns when the target plated thickness is 1.0 micron. Non-uniform surfaces commonly lead to over polishing in subsequent chemical mechanical polishing ("CMP") operations, which adversely affects the integrated circuits being manufactured.

In DC electroplating, additives such as accelerators, suppressors, and levelers are typically included in the electrolytic plating solution to improve electroplating behavior by, among others, enhancing chemical reactions, improving surface deposition, improving thickness uniformity, and enhancing filling of high aspect ratio features. A conventional electrolytic plating solution also includes sulfuric acid to provide high conductivity to the electrolyte and chloride ions to enhance additive performance. The presence of additives, sulfur ions, or chloride ions in an electrolytic plating bath, however, often leads to occlusion of undesired material in the deposited metal layer.

Various electroplating schemes have been suggested for avoiding problems commonly encountered in electroplating of metal, particularly copper, in integrated circuit fabrication. For example, U.S. Patent Application Publication No. US 2002/0056645 A1, published May 16, 2002, discloses a method using a sequence of anodic and cathodic current pulses to deposit a metal layer. U.S. Pat. No. 5,972,192, issued Oct. 26, 1999 to Dubin et al., discloses both unipolar (i.e., forward) pulse plating and forward-reverse pulse plating of copper. U.S. Pat. No. 6,432,821 B1, issued Aug. 13, 2002 to Dubin et al., discloses several electroplating programs combining forward and reverse current pulses. Similarly, U.S. Pat. No. 6,440,289 B1, issued Aug. 27, 2002 to Woo et al., teaches both forward-pulse and forward-reverse pulse techniques for electroplating. Reverse currents often introduce defects in plated films as a result of irregular etching of the metal (e.g., copper) or irregular desorption of additives from the metal surface.

SUMMARY OF THE INVENTION

The present invention helps to solve some of the problems outlined above by providing methods for reducing defects in electroplated metal, particularly for reducing protrusion defects, nonuniformities, and impurity levels in thin electroplated copper layers. The invention is described herein mainly with reference to the electroplating of thin copper films in integrated circuits. It is understood, however, that methods in accordance with the invention are also useful for electroplating other metals during integrated circuit fabrication.

A first basic embodiment of a method in accordance with the invention for depositing a metal layer to a selected thickness on a semiconductor wafer includes immersing the wafer in an electrolytic solution containing metal ions, biasing the wafer negatively with respect to the electrolytic solution to generate a DC current in the electrolytic solution, and interrupting the biasing to generate substantially zero current during a plurality of short pauses. Preferably, a method includes rotating the wafer in the electrolytic solution. Generally, it is desirable to deposit some of the copper layer before interrupting the bias. Typically, interrupting the bias, and thereby the DC current, commences after at least five or ten percent of the selected thickness of the metal layer has formed on the wafer. In some embodiments, interrupting the bias is started after about twenty, forty, or sixty percent of the selected total thickness of the metal layer has formed on the wafer. Biasing the wafer negatively generally includes generating a low first DC current during a first plating time, and thereafter increasing the bias to generate a high second DC current during a second plating time after at least approximately ten percent of the selected thickness of the metal layer has formed on the wafer.

Typically, biasing the wafer negatively is conducted to generate one or more intermediate DC currents during one or more intermediate plating times between an initial plating time and a final plating time. It is understood that innumerable variations of methods in accordance with the invention include applying bias at various levels and thereby generating corresponding different DC current densities in the plating solution, and interrupting the DC current at various current levels and at various times during a fabrication process. Preferably, interrupting DC current in accordance with the invention is conducted substantially during electroplating of the final fifty percent of the total thickness.

In one aspect of the invention, the biasing negatively comprises biasing the wafer during a total deposition time comprising a time period in a range of about from 5 seconds to 300 seconds to generate a DC current having a current density in a range of about from 1 Amp/cm$^2$ to 150 Amp/cm$^2$. In another aspect, biasing the substrate wafer negatively comprises biasing the wafer during a plurality of bias-on-times during the second plating time, in which a bias-on-time typically comprises a time period in a range of from 0.1 second to 30 seconds, preferably from one second to 15 seconds, and more preferably more than two seconds.

In another aspect, each of the short pauses comprises a pause time in a range of about from 2 milliseconds to 5 seconds, generally in a range of about from 5 milliseconds to 2 seconds, and typically in a range of about from 10 milliseconds to 500 milliseconds, depending on particular operating parameters. Typically, for depositing a metal layer having a thickness of 1 micron or less, the plurality of short pauses comprises a number of pauses in a range of about from 2 pauses to 100 pauses, preferably from 3 pauses to 15 pauses.

A second basic embodiment of the invention for depositing a metal layer to a selected thickness on a semiconductor wafer includes immersing the wafer in an electrolytic solution containing metal ions, biasing the wafer negatively with respect to the electrolytic solution to generate a DC current in the electrolytic solution, rotating the wafer in the electrolytic solution at a first rotation rate during a first plating time, and thereafter rotating the wafer at a second rotation rate during a second plating time, the second rotation rate being less than the first rotation rate. Typically, the second rotation rate does not exceed 50 rotations per minute (rpm). Generally, it is desirable to maintain relatively high rate of mass transfer of metal ions and additives at the substrate surface during initial stages of electroplating a layer of metal. Some embodiments in accordance with the invention include rotating the substrate wafer at a relatively high conventional speed, for example, 125 rpm, and then reducing the rotation speed down to 10 rpm or 25 rpm after approximately ten, twenty, forty, or even sixty percent of the selected thickness of the metal layer has formed on the wafer. Other embodiments in accordance with the invention, however, include rotating the substrate wafer at a reduced rotation rate during substantially all of the plating time. In a further aspect of the invention, biasing the wafer generates a low first DC current during the first plating time; and thereafter increasing the biasing level to generate a high second DC current during the second plating time after at least approximately ten percent of the selected thickness of the metal layer has formed on the wafer. In another aspect, the wafer is biased to generate one or more intermediate DC currents during one or more intermediate plating times between the first plating time and the second plating time.

Exemplary methods include biasing the wafer during a total deposition time of about from 5 seconds to 300 seconds to generate a DC current having a current density in a range of about from 1 Amp/cm$^2$ to 150 Amp/cm$^2$. The rotation rate of the wafer during the second plating time is generally substantially lower than during the first plating time. In some embodiments, however, a second, low rotation rate is conducted during only a portion of the second plating time.

A third basic embodiment in accordance with the invention includes combining processes of interrupting DC current and reducing the rotation rate. Accordingly, in one aspect, some embodiments in accordance with the invention comprise immersing the wafer in an electrolytic solution containing metal ions, rotating the wafer at a first rotation rate during a first plating time, biasing the wafer negatively with respect to the electrolytic solution to generate a DC current in the electrolytic solution, and interrupting the biasing to generate substantially zero current during a plurality of short pauses. Current interruptions are typically commence during a second plating time after at least approximately ten percent of the selected thickness of the metal layer has formed on the wafer. Also, the wafer is rotated at a second rotation rate during the second plating time after approximately ten percent of the selected thickness of the metal layer has formed on the wafer. Typically, the second, or low, rotation rate does not exceed 50 rpm. Typically, the first rotation rate is greater than the second rotation rate. Generally, a method provides for depositing at least about ten percent of the total thickness of the layer before beginning current interruption and reduction of rotation rate; however, in some embodiments, current interruption and rotation at low rpm do not commence until after twenty, forty, or even sixty percent of the total thickness of the layer has been electroplated. In exemplary embodiments, the DC current in the electrolytic solution has a current density in a range of about from 1 Amp/cm$^2$ to 150 Amp/cm$^2$. Typically, biasing the wafer negatively generates a low first DC current during the first plating time, and a high second DC current during the second plating time. In some exemplary embodiments, biasing negatively comprises generating the low first DC current having a current density in a range of about from 1 mA/cm$^2$ to 8 mA/cm$^2$ during the first plating time, and generating the high second DC current having a current density in a range of about from 25 mA/cm$^2$ to 110 mA/cm$^2$ during the second plating time. In some embodiments, biasing the substrate negatively comprises biasing the substrate to generate one or more intermediate DC currents during one or more intermediate plating times between the first plating time and the second plating time. In some exemplary embodiments, biasing negatively generates an intermediate DC current having a current density in a range of about from 5 mA/cm$^2$ to 20 mA/cm$^2$ during the intermediate plating time. Other exemplary embodiments include rotating the wafer at an intermediate rotation rate during the intermediate plating time, the intermediate rotation rate having a speed between the first rotation rate and the second rotation rate.

In some embodiments for electroplating copper, biasing the wafer negatively is conducted during a total deposition time of about from 5 seconds to 300 seconds. The term "total deposition time" means the total on-time of biasing. Terms such as "second plating time" in which current interruption is conducted include bias-on-times and bias-off-times; however, practically the sum of bias-off-times is typically relatively short compared to the "plating time". In another aspect, biasing the substrate wafer negatively comprises biasing the wafer during a plurality of bias-on-times during the second plating time, in which a bias-on-time typically comprises a time period in a range of from 0.1 second to 30 seconds, preferably from one second to 15 seconds, and more preferably more than two seconds. Generally, each of the short pauses comprises a pause time in a range of about from 2 milliseconds to 5 seconds, typically from 5 milliseconds to 2 seconds, and preferably from 10 milliseconds to 500 milliseconds, depending on operating parameters. Typically, a method in accordance with the invention includes from 2 pauses to 60 pauses. In another aspect, the second rotation rate does not exceed 25 rpm. In another aspect, the second rotation rate does not exceed 10 rpm. Some embodiments in accordance with the invention further include rotating the wafer at a bias-off-time rotation rate during at least one of the pauses, wherein the bias-off-time rotation rate is greater than the second, low rotation rate used during the bias-on-time. Some embodiments in accordance with the invention are further characterized in that the wafer is never biased positively with respect to the electrolytic solution.

DETAILED DESCRIPTION OF PREFERRED EMBODIMENTS

Figure 1:
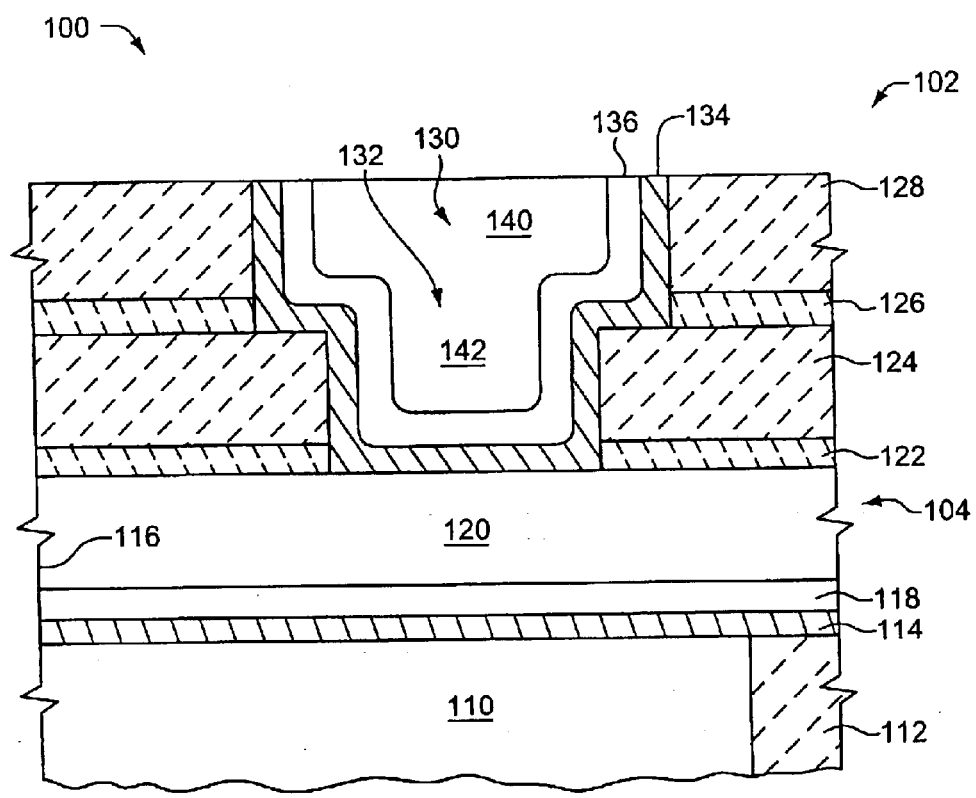
FIG. 1 depicts in schematic form a section of an integrated circuit including electroplated metal layers fabricated in accordance with the invention.
Figure 2:
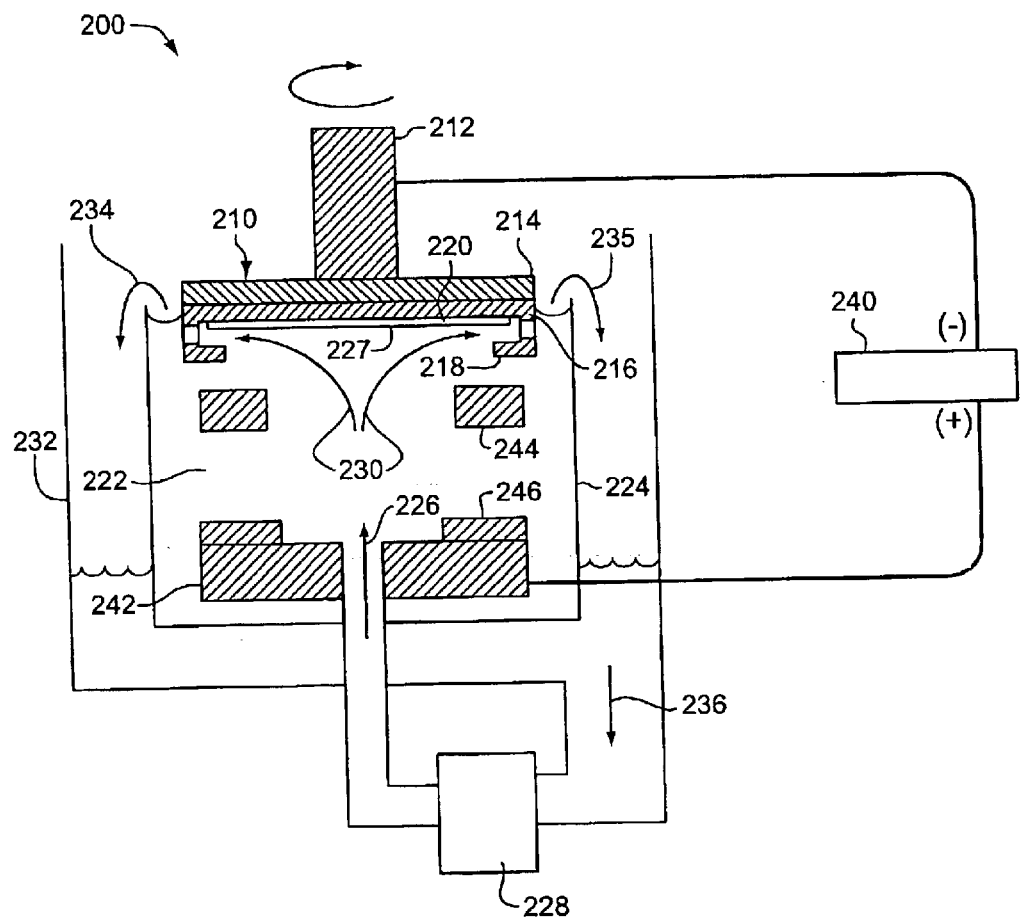
FIG. 2 depicts in schematic form a cross-sectional view of a generalized electroplating apparatus suitable for performing a method in accordance with the invention.

The invention is described herein with reference to FIGS. 1–9. It should be understood that the structures and systems depicted in schematic form in FIGS. 1 and 2 are used to explain the invention and are not precise depictions of actual structures and systems in accordance with the invention. Furthermore, the preferred embodiments described herein are exemplary and are not intended to limit the scope of the invention, which is defined in the claims below.

Embodiments in accordance with the invention compensate for electrical resistance and voltage drop across the wafer, particularly during phases of electrochemical treatment when the conductive metal film at the treatment surface of the substrate is especially thin; for example, at the beginning of an electroplating process when the thin seed layer dominates DC current flow and voltage drop, or in later stages of an electropolishing operation. Such compensation is generally conducted by shaping a potential drop in the electrolyte bath corresponding but inverse to the electrical resistance and voltage drop across the wafer substrate, thereby achieving a uniform (or tailored, if desired) current distribution. As the electroplated layer becomes thicker and the terminal effect decreases, preferred embodiments in accordance with the invention effect a transition to a uniform plating distribution by dynamically varying the electrical field and current source that the wafer experiences.

In this specification, the terms "anode" and "cathode" refer to structures at which an oxidation and reduction process occur, respectively. In descriptions of electroplating systems and methods, the term "cathode" refers to the workpiece, typically an integrated circuit wafer, and the term "anode" refers to the counter-electrode.

The terms "current on-time" and "bias-on-time" are used synonymously in this specification.

In this specification, operations such as interrupting current and rotating a wafer are described as commencing or being conducted after a certain percentage of a selected thickness of metal layer has formed on the wafer. This language indicates that the operation or operations do not commence until at least the stated percentage of final thickness has formed, and also that the operation or operations could be conducted later in the fabrication process. For example, when it is stated that interruption of current is conducted after ten percent of a selected thickness of metal layer has formed, it means that interruption may begin after ten percent has formed or any time thereafter, but not before ten percent has formed.

FIG. 1 depicts in schematic form a section 100 of an integrated circuit 102 including electroplated metal layers fabricated in accordance with the invention. The structure of section 100 is exemplary, and it is understood that metal layers fabricated by methods in accordance with the invention are useful in innumerable designs and types of devices of the integrated circuit art. Integrated circuit 102 disposed on semiconductor wafer 104 includes a gate region 110 and dielectric oxide 112 of an integrated circuit device. A conventional adhesion/barrier layer 114 covers the bottom and sides (not shown) of a trench 116 located above gate region 110 and dielectric oxide 112. Adhesion/barrier layer 114 typically comprises tantalum. Copper seed layer 118 formed using techniques known in the art is disposed on adhesion/barrier layer 114 and covers the inner surface of trench 116. The remainder of trench 116 is filled by electroplated copper layer 120, deposited in accordance with the invention. Integrated circuit 102 further includes dielectric barrier/etch stop layer 122, dielectric oxide layer 124, dielectric barrier/etch stop layer 126, and dielectric oxide layer 128, as known in the art. Using patterning and etching techniques known in the art, a trench 130 and via 132 have been formed. A second adhesion/barrier layer 134 lines the sides and bottoms of trench 130 and via 132. A second copper seed layer 136, formed using techniques known in the art, is deposited on adhesion/barrier layer 134 and lines the inside surfaces of trench 130 and via 132. The remaining portions of trench 130 and via 132 are filled by electroplating copper deposited by a method in accordance with the invention, to form conductive interconnect 140 and conductive plug 142. As depicted in FIG. 1, conductive copper interconnect 140 is substantially perpendicular to copper layer 120, and conductive copper plug 142 serves to connect electrically conductive copper interconnect 140 to copper layer 120.

FIG. 2 depicts in schematic form a cross-sectional view of a generalized electroplating apparatus 200 suitable for performing a method in accordance with the invention. Apparatus 200 includes a clamshell wafer holder 210 mounted on a rotatable spindle 212, which allows rotation of clamshell 210 at a controllably variable rotation rate. A clamshell wafer holder 210 has been described in commonly-owned U.S. Pat. No. 6,156,167, issued Dec. 5, 2002 to Patton et al., which is hereby incorporated by reference. Clamshell 210 comprises a cone 214, a cup 216, and a flange 218. Flange 218 is known in the art, and is implemented in various forms to control the DC current density at the edge of a wafer and thereby reduce the "terminal effect" during initial stages of electroplating. For electroplating, a wafer 220 having plating surface 221 is mounted in cup 216. Clamshell 210 and wafer 220 are immersed in a plating bath 222 containing plating solution and located in bath container 224. As indicated by arrow 226, plating solution is continually delivered into bath container 224 by a pump 228. Generally, plating solution flows upwards towards the center of wafer 220 and then radially outwards and across wafer plating surface 221, as indicated by arrows 230. The plating solution then overflows bath container 224 and flows into overflow reservoir 232, as indicated by arrows 234, 235. The plating solution is then filtered (not shown) and returned to pump 228, as indicated by arrow 236.

A DC power supply 240 and a negative output lead are electrically connected to wafer 220 through one or more rings, brushes, and contacts (not shown) mounted in wafer holder 210. The positive output lead of power supply 240 is electrically connected to an anode 242 located in plating bath 222 at the bottom of bath container 224. Shields 244, 246 are provided to shape the electric field between anode 242 and cathode wafer 220. Preferably, flange 218 and shields 244, 246 are dynamically variable, as disclosed in U.S. Pat. No. 6,402,923 B1, issued Jun. 11, 2002 to Mayer et al., which is hereby incorporated by reference. An apparatus suitable for conducting a method in accordance with the invention is disclosed in co-owned and copending U.S. patent application Ser. No. 10/116,077, filed Apr. 4, 2002, which is hereby incorporated by reference.

Figure 3:
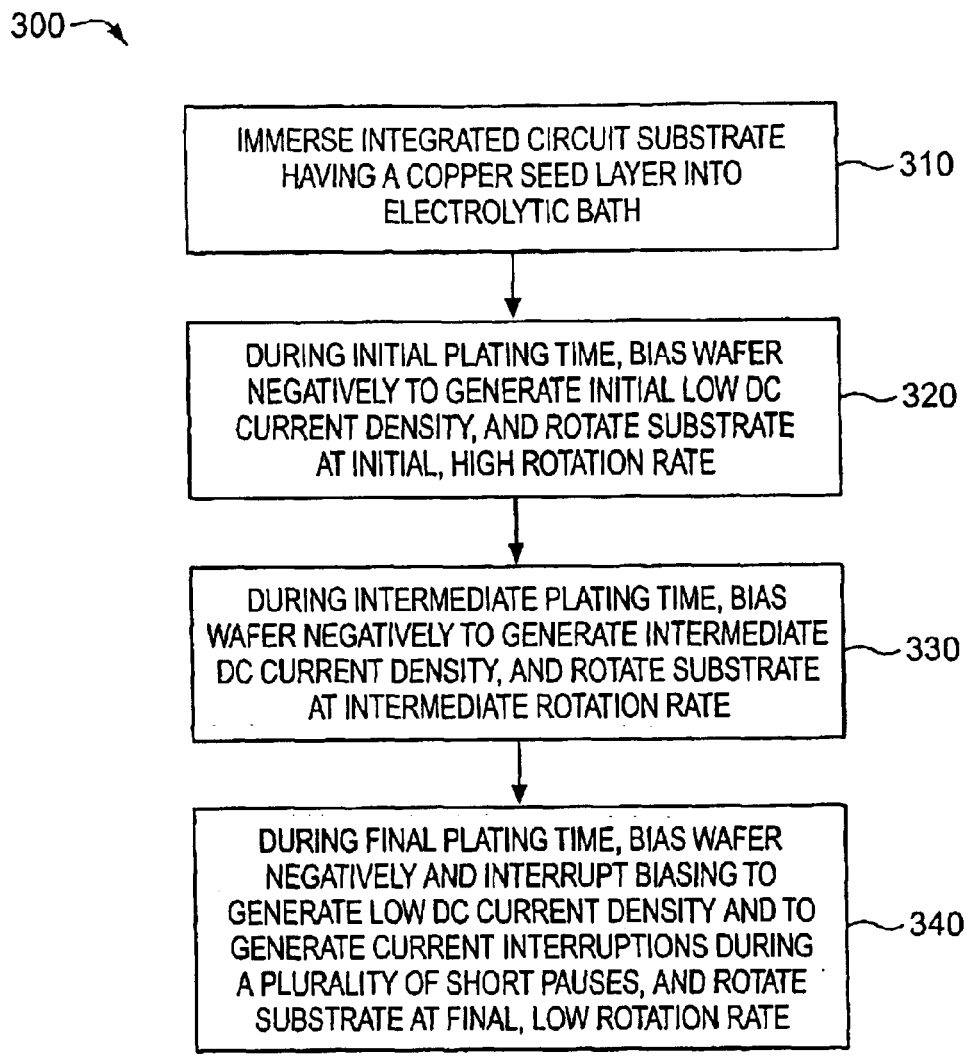
FIG. 3 contains a process flow sheet of a generalized preferred method for electroplating copper in accordance with the invention.

FIG. 3 contains a process flow sheet of a generalized preferred method 300 in accordance with the invention. Method 300 is described herein with reference to apparatus 200 of FIG. 2, although it is understood that a method in accordance with the invention can be practiced using a wide variety of apparati. In processes 310, integrated circuit substrate wafer 220, typically having a copper seed layer, is immersed into electrolytic bath 222 by lowering substrate holder 210 into bath container 224. Electrolytic bath 222 typically comprises electrolytic plating solution containing copper ions and additives known in the art. Preferably, processes 310 include rotating substrate wafer 220 while immersing it to reduce formation of bubbles on deposition surface 221 and to remove any bubbles that form during immersion. In processes 320, during an initial plating time, a negative bias is applied to substrate wafer 220, which acts as a cathode, and a positive bias is applied to anode 242, thereby generating an initial low DC current of electrolytes toward wafer deposition surface 221. Preferably, in processes 320, substrate wafer 220 is rotated at an initial, high rotation rate to enhance mass transfer of plating-solution solutes at deposition surface 221. Processes 330 include applying a negative bias to substrate wafer 220, during an intermediate plating time, to generate an intermediate DC current of electrolytes toward wafer deposition surface 221. Processes 330 also include rotating substrate wafer 220 at an intermediate rotation rate. Processes 340 include applying a negative bias to substrate wafer 220 during a final plating time and interrupting the biasing during a plurality of short pauses. During the bias-off-time of the pauses, substantially zero DC current is generated. During the bias-on-time of the final plating time, a DC current of electrolytes is generated toward substrate surface 221, but preferably at a lower current density than during the first plating time and the intermediate plating time. Processes 340 also preferably include rotating substrate wafer 220 at a final, low rotation rate that is slower than the first rotation rate or the intermediate rotation rate. Typically, substrate wafer 220 is rotated at the final, low rotation rate during bias-off-times of pauses, as well as during bias-on-times. In an alternative embodiment in accordance with the invention, processes 340 include rotating the substrate wafer during a bias-off-time at a bias-off-time rotation rate that is faster than the final, low rotation rate, which is usually applied during bias-on-times.

Selection of values of the various variables in accordance with the invention is based on numerous factors including, among others, composition of plating solution, desired deposition rate, desired plating film thickness, substrate surface area, and plating temperature. An exemplary plating solution comprises forty grams per liter ("g/l") of dissolved copper metal, added as copper sulfate pentahydrate ($CuSO_4 \cdot 5H_2O$); 10 g/l $H_2SO_4$; 50 milligrams per liter (mg/l) chloride ion, added as HCl; 6 milliliters per liter (ml/l) Viaform accelerator; 2 ml/l Viaform suppressor; and 2.5 ml/l Viaform leveler. For electroplating a corresponding copper layer at room temperature onto a 200 mm wafer to a thickness of 0.7 μm in accordance with method 300 of FIG. 3, typical ranges of operating parameters are represented by the following: an initial DC current density in a range of about from 1 $mA/cm^2$ to 8 $mA/cm^2$ for an initial plating time in a range of about from 5 seconds to 60 seconds, at an initial rotation rate in a range of from 50 rpm to 200 rpm, typically about 125 rpm; an intermediate DC current density in a range of about from 5 $mA/cm^2$ to 20 $mA/cm^2$ for an intermediate plating time of about from 10 seconds to 120 seconds, at an intermediate rotation rate in a range of from 50 rpm to 200 rpm, typically about 125 rpm; and a final DC current density in a range of about from 25 $mA/cm^2$ to 110 $mA/cm^2$ for a final plating time in a range of about from 15 seconds to 120 seconds bias-on-time, at a final rotation rate in a range of from 5 rpm to 40 rpm, typically about 10 rpm. Biasing is interrupted during the final plating time with bias-off pauses in a range of about from 5 msec to 2 seconds, preferably in a range of about from 10 msec to 500 msec. The number of pauses during the final plating time typically comprises from 2 pauses to 60 pauses, and preferably from 3 pauses to 15 pauses. Interruptions of biasing and reduction of wafer rotation rates can be implemented in accordance with the invention during initial stages of electroplating, for example, during plating of the initial twenty percent of the total film thickness. Usually, however, this slows down fabrication throughput unnecessarily. Also, limited periods of no interruptions or long bias-on-times, for example, ten seconds or more, can be implemented during later stages of deposition, for example, after deposition of the initial twenty percent of total film thickness, without necessarily adversely affecting film quality.

EXAMPLE 1

A method in accordance with the invention was conducted using a Novellus Model Sabre xT apparatus to deposit copper on an integrated circuit substrate wafer. Process specifications of a standard Sabre xT copper DC electrofill process as known in the art were modified by interrupting biasing in accordance with the invention. A 200 mm silicon wafer having a copper seed layer with a thickness of approximately 100 nm was plated with copper using a standard copper plating solution. The plating solution contained: 40 grams per liter ("g/l") of dissolved copper metal, added as copper sulfate pentahydrate ($CuSO_4 \cdot 5H_2O$); 10 g/l $H_2SO_4$; 50 milligrams per liter (mg/l) chloride ion, added as HCl; 6 milliliters per liter (ml/l) Viaform accelerator; 2 ml/l Viaform suppressor; and 2.5 ml/l Viaform leveler. The Viaform accelerator, suppressor, and leveler are commercially available from Enthone Company. Copper plating was conducted at room temperature, that is, at about 25° C. The plating solution was pumped into the plating chamber at a volumetric flow rate of about 12 liters per minute.

Electroplating of copper was conducted, by interrupting negative biasing and thereby DC current in accordance with the invention. For comparison, electroplating was also conducted without interruption of current and with non-optimal current interruption. Table 1 presents characteristics of several DC current waveforms used to electroplate copper on a series of semiconductor wafers.

TABLE 1

| Waveform | $1^{st}$ current [Amp] | DC bias time [sec] | $2^{nd}$ current [Amp] | DC bias time [sec] | $3^{rd}$ current [Amp] | DC bias time [sec] | Number of interruptions | Cu film [μm] |
|---|---|---|---|---|---|---|---|---|
| 1 | 1 | 11 | 3 | 30 | 18 | 3.3 | 8 (step 3) | 0.7 |
| 2 | 1 | 11 | 3 | 30 | 18 | 8.8 | 3 (step 3) | 0.7 |
| 3 | 1 | 11 | 3 | 10 | 18 | 26.3 | 3 (step 2) | 0.7 |
| POR | 1 | 11 | 3 | 30 | 18 | 26.3 | 0 | 0.7 |

In Waveform 1 in accordance with the invention, after immersion of the substrate wafer into the plating solution, the wafer cathode was negatively biased during a first plating time of 11 seconds to generate a DC current of 1 amp between the anode and the cathode, which corresponds to a DC current density of approximately 3.2 $mA/cm^2$ at the deposition surface of the 200 mm wafer. During an intermediate plating time of 30 seconds, a negative bias was applied to generate a DC current of 3 amps, corresponding to a current density of 10 $mA/cm^2$ at the deposition surface of the wafer. Then, during a final plating time, a negative bias was applied during 8 current on-times of 3.3 seconds each, thereby generating a DC current of 18 amps, corresponding to a current density of 57 $mA/cm^2$. The DC bias during the final plating time was interrupted by a pause of approximately 50 msec preceding each current on-time. During the bias off-time of each pause, the DC current between the anode and the cathode was substantially zero. The resulting layer deposited on each wafer had a thickness of approximately 0.7 μm, or 700 nm.

Generally, the amount of metal deposited during a given time of a plating process is linearly proportional to the DC current density multiplied by time. Therefore, approximately eighteen percent of the total deposited thickness of 0.7 μm was deposited before current interruptions of Waveform 1 were conducted.

In Waveform 2 in accordance with the invention, after immersion of the substrate wafer into the plating solution, the wafer cathode was negatively biased during a first plating time of 11 seconds to generate a DC current of 1 amp between the anode and the cathode, which corresponds to a DC current density of approximately 3.2 mA/cm$^2$ at the deposition surface of the 200 mm wafer. Then, during an intermediate plating time of 30 seconds, a negative bias was applied to generate a DC current of 3 amps, corresponding to a current density of 10 mA/cm$^2$ at the deposition surface of the wafer. Then, during a final plating time, a negative bias was applied during 3 current on-times of 8.8 seconds each, thereby generating a DC current of 18 amps, corresponding to a current density of 57 mA/cm$^2$. The DC bias during the final plating time was interrupted by a pause of approximately 50 msec preceding each current on-time. During the bias off-time of each pause, the DC current between the anode and the cathode was substantially zero. The resulting layer deposited on each wafer had a thickness of approximately 0.7 μm, or 700 nm.

Generally, the amount of metal deposited during a given time of a plating process is linearly proportional to the current density multiplied by time. Therefore, approximately eighteen percent of the total deposited thickness of 0.7 μm was deposited before current interruptions of Waveform 2 of Table 1 were conducted in accordance with the invention.

In Waveform 3 of Table 1, after immersion of the substrate wafer into the plating solution, the wafer cathode was negatively biased during a first plating time of 11 seconds to generate a DC current of 1 amp between the anode and the cathode, which corresponds to a DC current density of approximately 3.2 mA/cm$^2$ at the deposition surface of the 200 mm wafer. Then, during an intermediate plating time, a negative bias was applied during 3 current on-times of 10 seconds each, thereby generating a DC current of 3 amps, corresponding to a current density of 10 mA/cm$^2$. The DC bias during the intermediate plating time was interrupted by a pause of approximately 50 msec preceding each DC current on-time. During the bias off-time of each pause, the DC current between the anode and the cathode was substantially zero. Then, during a final plating time of 26.3 seconds, a negative bias was applied to generate a DC current of 18 amps, corresponding to a current density of 57 mA/cm$^2$ at the deposition surface of the wafer. The resulting layer deposited on each wafer had a thickness of approximately 0.7 μm, or 700 nm.

In Waveform "POR" ("process of record") of Table 1, representing a conventional process, after immersion of the substrate wafer into the plating solution, the wafer cathode was negatively biased during a first plating time of 11 seconds to generate a DC current of 1 amp between the anode and the cathode, which corresponds to a DC current density of approximately 3.2 mA/cm$^2$ at the deposition surface of the 200 mm wafer. Then, during an intermediate plating time of 30 seconds, a negative bias was applied to generate a DC current of 3 amps, corresponding to a current density of 10 mA/cm$^2$ at the deposition surface of the wafer. Then, during a final plating time, a negative bias was applied during 26.3 seconds, thereby generating a DC current of 18 amps, corresponding to a current density of 57 mA/cm$^2$. The DC bias during the final plating time was not interrupted. The resulting layer deposited on each of a series of wafers had a thickness of approximately 0.7 μm, or 700 nm.

The substrate wafers were rotated at a standard rotation rate of 125 rpm during the electroplating operations.

Figure 4:
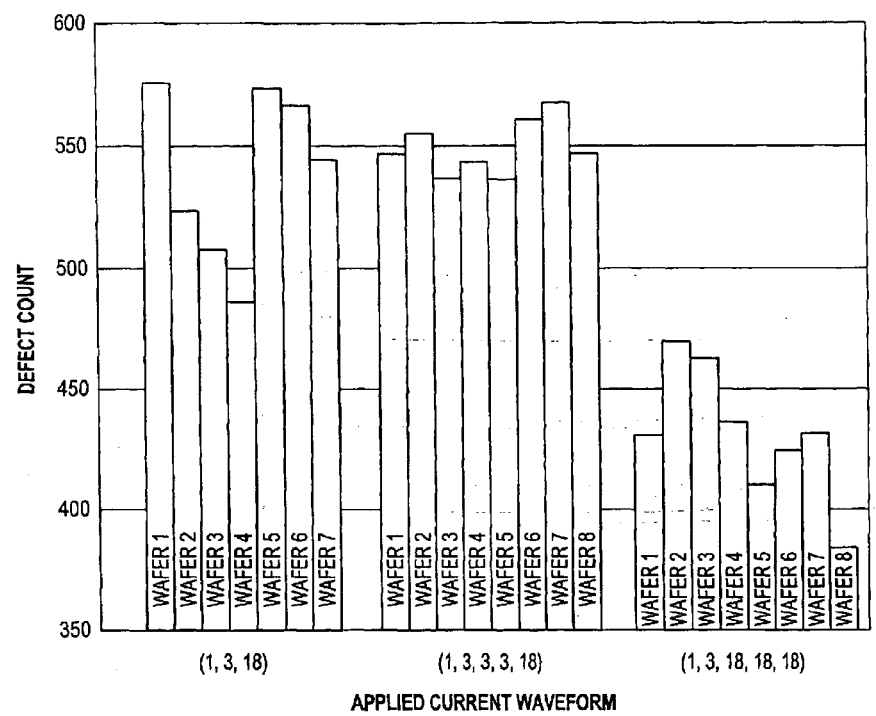
FIG. 4 contains a graph in which defect count, represented by a bar for each examined wafer, is plotted as a function of an applied current waveform.

A KLA-Tencor AIT II optical-contrast system was used together with an optical microscope in a SEM technique to identify defects in the electroplated copper layers. FIG. 4 contains a graph in which defect count, represented by a bar for each examined wafer, is plotted as a function of an applied current waveform of Table 1. The resulting defect counts of seven wafers fabricated according to the conventional POR waveform are designated by "(1, 3, 18)" on the abscissa of FIG. 4. Similarly, the defect counts of eight wafers fabricated in accordance with Waveform 3 of Table 1 are designated by "(1, 3, 3, 3, 18)" on the abscissa of FIG. 4. Similarly, the defect counts of eight wafers fabricated in accordance with Waveform 2 of Table 1 are designated by "(1, 3, 18, 18, 18)" on the abscissa of FIG. 4. The data clearly show that current interruptions during the third, final plating time led to a significant reduction of isolated protrusions.

EXAMPLE 2

Figure 5:
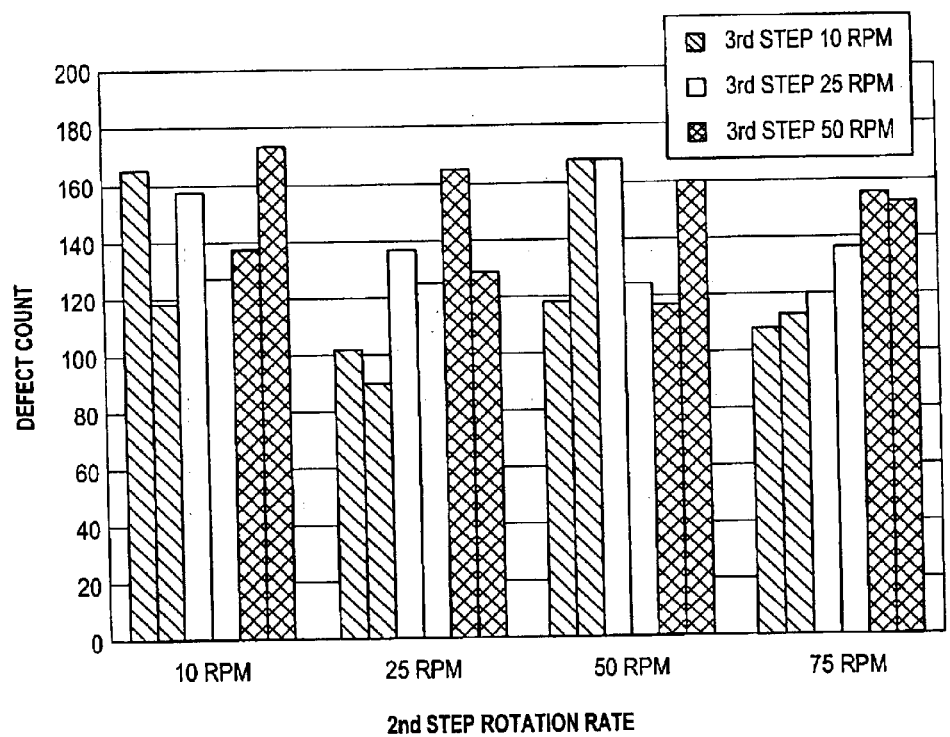
FIG. 5 shows a graph in which measured defect count is plotted as a function of intermediate 2nd-step rotation rate.

A copper layer having a thickness of 0.7 μm, or 700 nm, was electroplated on a series of wafers using Waveform 2 as implemented in Example 1 above, but the rotation rate of the wafer was varied during electroplating. During the intermediate plating time of Waveform 2, each substrate wafer was rotated at a speed selected from 10, 25, 50, and 75 rpm. During the final 3rd-step plating time, each substrate wafer was rotated at a speed selected from 10, 25, and 50 rpm. Defects were measured as described in Example 1. FIG. 5 shows a graph in which measured defect count is plotted as a function of intermediate 2nd-step rotation rate. The results show that the 2nd-step rotation rate did not have a substantial effect on protrusion-defect counts. In contrast, there is a correlation between 3rd-step rotation rate and defect count. A copper layer fabricated using a final 3rd-step rotation rate of 10 rpm generally has a lower defect count than copper layers fabricating using a final 3rd-step rotation rate of 25 rpm or 50 rpm.

EXAMPLE 3

A copper layer having a thickness of 0.7 μm, or 700 nm, was electroplated on a series of wafers as in Example 1, but using various combinations of DC current waveforms and varied rotation rates in accordance with the invention. Defects were measured as described in Example 1.

Figure 6:
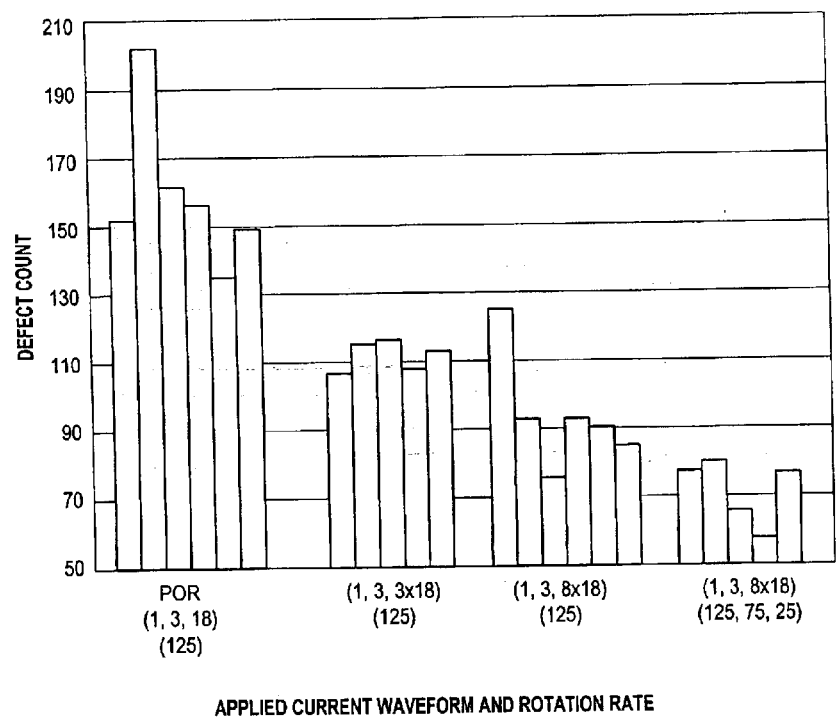
FIG. 6 contains a graph in which defect count is plotted as a function of a particular combination of waveform and 2nd-step and 3rd-step rotation rates.
Figure 7:
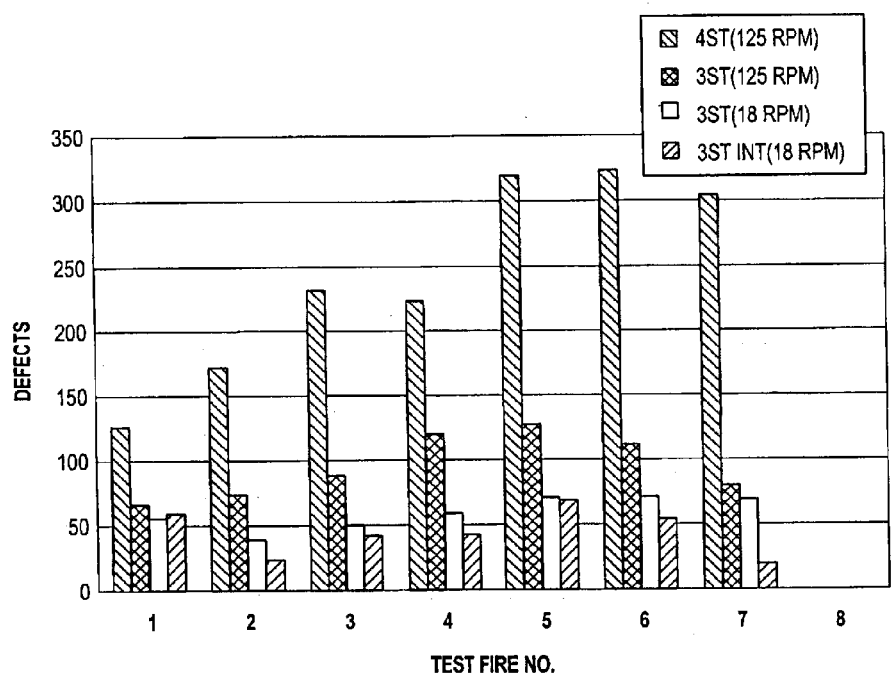
FIG. 7 contains a graph in which measured defect counts of copper layers deposited using various current waveforms and rotation rates are plotted as a function of test-fire number.

FIG. 6 contains a graph in which defect count is plotted as a function of a particular combination of waveform and 2nd-step and 3rd-step rotation rates. The first set of bars plotted at the left of the graph of FIG. 6 represents defect counts in copper layers fabricating using the conventional POR of Table 1 and a standard rotation rate of 125 rpm. The second set of bars from the left represents defect counts of copper layers formed using Waveform 2 of Table 1 in accordance with the invention, without varying the standard rotation rate of 125 rpm. The third set of bars from the left represents defect counts of copper layers formed using Waveform 1 of Table 1, in accordance with the invention, without varying the standard rotation rate of 125 rpm. The fourth set of bars at the right side of the graph represents defect counts of copper layers formed using Waveform 1 of Table 1, in accordance with the invention, and decreasing the rotation rate from 125 rpm to 75 rpm during the intermediate 2nd-step plating time, and further decreasing the rotation rate from 75 rpm to 25 rpm during the final 3rd-step plating time. Comparison of the results show a substantial decrease in defect count between copper layers fabricating using the conventional POR and copper layers fabricating using a current waveform in accordance with the invention. The results further show that increasing the number of interruptions in the final plating step from 3 interruptions (Waveform 2) to 8 interruptions (Waveform 1) generally decreases the number of defects. The number of defects is decreased even further using Waveform 1 by decreasing the speed of the rotation rate from 125 rpm to 75 rpm and 25 rpm during the intermediate and final plating times, respectively.

EXAMPLE 4

A long-term marathon test was conducted using the apparatus and plating solution of Example 1 to establish the impact of process modifications on long-term plating tool behavior and film properties. Conventional three-step and four-step current waveforms were used with a constant rotation rate of 125 rpm. The conventional three-step waveform corresponded to the Waveform POR of Table 1, except the first current step was conducted at 0.5 amps for 22 seconds. The conventional four-step waveform had a first current step of 0.5 amps for 22 seconds, a second current step of 3 amps for 30 seconds, a third current step of 7.5 amps for 20 seconds, and a fourth current step of 15 amps for 35 seconds. Also, a conventional three-step waveform was used, but the rotation rate was decreased from 125 rpm to 18 rpm during the final third step. Further, a three-step waveform corresponding to Waveform 1 of Table 1 with interruptions of 50 msec in accordance with the invention and including decreasing the rotation rate from 125 rpm to 18 rpm during the final third step was used. Seven test fires were taken every other day. Defects were measured using the technique described in Example 1. The results are plotted in the graph of FIG. 7, in which measured defect counts are plotted as a function of test-fire number. The data show that current interruption and low 3rd-step rotation speed in accordance with the invention result in the lowest defect counts in copper layers deposited throughout the marathon test.

Figure 8:
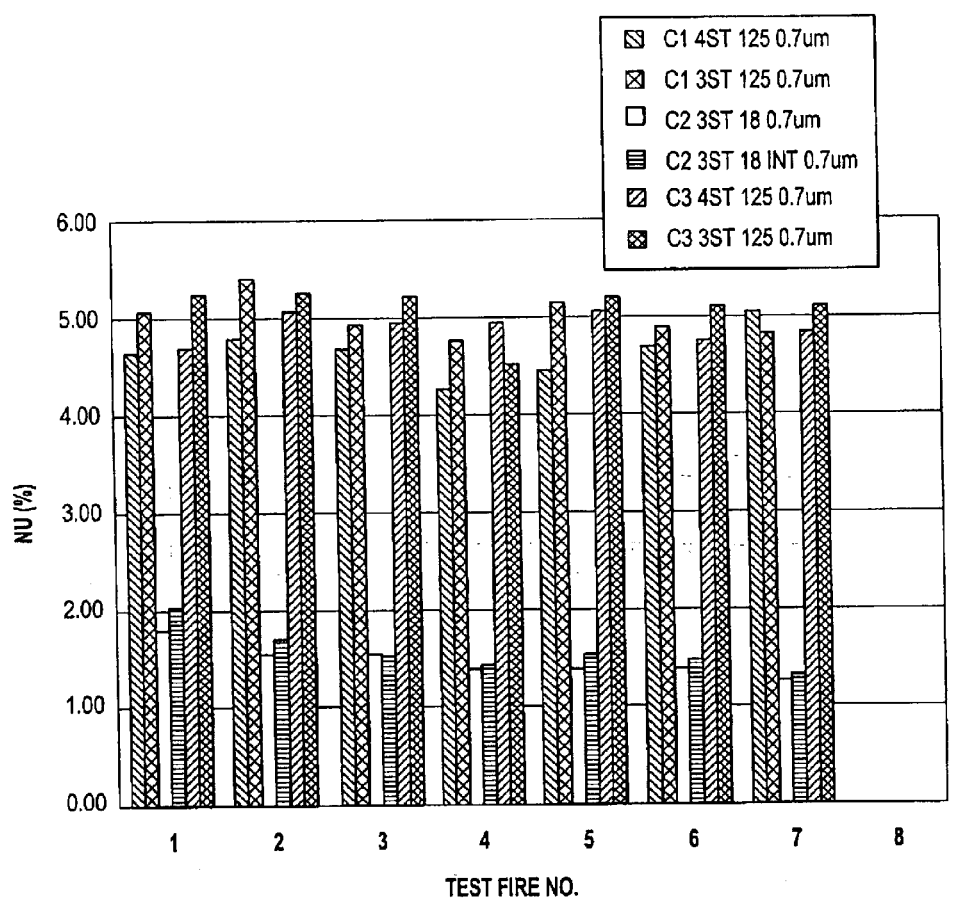
FIG. 8 depicts a bar graph in which near-edge nonuniformity (NU) percent of copper layers deposited using various current waveforms and rotation rates is plotted as a function of test-fire number.

Copper layers were electroplated using two different plating cells under identical operating conditions. Near-edge nonuniformity was measured using a standard technique out to a radial position of 96.5 mm radial distance from the center of the 200 mm wafers. Nonuniformity percent was calculated by dividing the standard deviation of thickness measurements by the nominal thickness and multiplying by 100. FIG. 8 depicts a bar graph in which near-edge nonuniformity (NU) percent is plotted as a function of test-fire number for Cell 1 (C1) and Cell 2 (C2) wafers. The data show that nonuniformity in layers fabricated using the rotation rate of 18 rpm in the final third step of both a conventional three-step waveform and a current waveform with interruptions was significantly lower than in layers fabricated using a conventional current waveform at 125 rpm.

EXAMPLE 5

Figure 9:
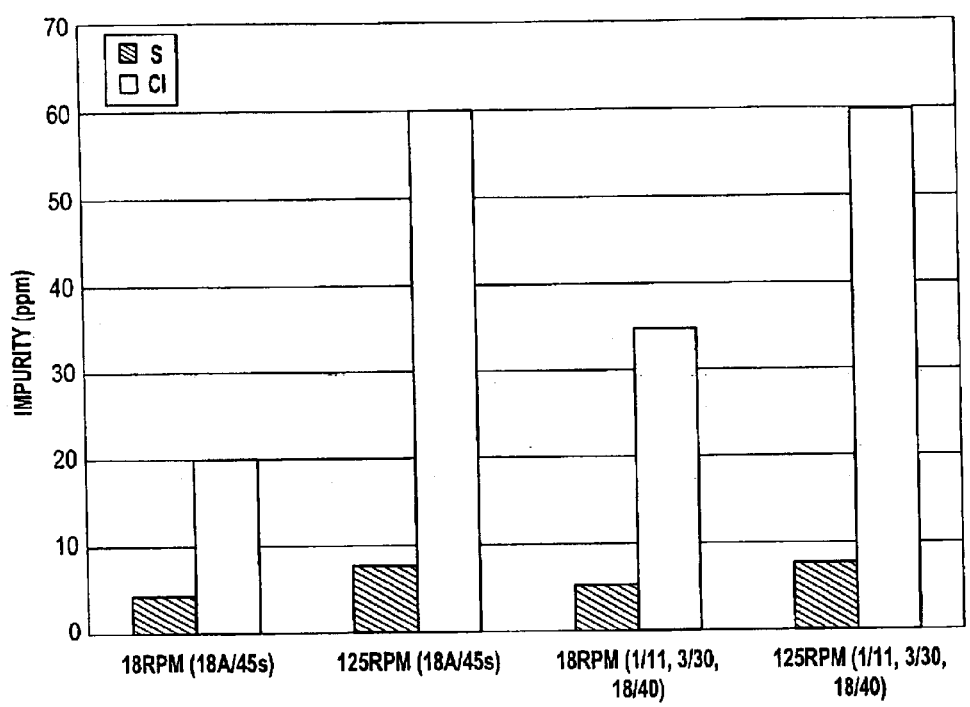
FIG. 9 contains a bar graph of impurity levels of sulfur and chloride, in units of parts per million ("ppm"), in copper layers deposited using various current waveforms and rotation rates.

The effect of rotation rate on incorporation of sulfur and chloride impurities into electroplated copper films was studied. With an apparatus and plating solution as described in Example 1, copper layers were deposited on wafer substrates using two different current waveforms without current interruption. The first waveform comprised application of a negative bias to the substrate to generate a DC current of 18 amps either at a rotation rate of 125 rpm, or at a low rotation rate of 18 rpm, in accordance with the invention. A second waveform comprised an initial plating step of generating a DC current of 1 amp for 11 seconds, an intermediate plating step of generating DC current of 3 amps for 30 seconds, and final plating step of 18 amps for 40 seconds. The final plating step was conducted either at 125 rpm, or at 18 rpm, in accordance with the invention. The concentrations of sulfur and chloride impurities in the layers were measured using secondary ion mass spectroscopy. FIG. 9 contains a bar graph of impurity levels, in units of parts per million ("ppm"). The data in FIG. 9 show that a low rotation rate in accordance with the invention decreases impurity levels of sulfur and chlorides in the electroplated copper.

Methods in accordance with the invention are useful in a wide variety of circumstances and applications. It is evident that those skilled in the art may now make numerous uses and modifications of the specific embodiments described, without departing from the inventive concepts. It is also evident that the steps recited may, in some instances, be performed in a different order; or equivalent structures and processes may be substituted for the structures and processes described. Since certain changes may be made in the above systems and methods without departing from the scope of the invention, it is intended that all subject matter contained in the above description or shown in the accompanying drawings be interpreted as illustrative and not in a limiting sense. Consequently, the invention is to be construed as embracing each and every novel feature and novel combination of features present in or inherently possessed by the methods and structures described in the claims below and by their equivalents.

What is claimed is:

1. A method of depositing a metal layer to a selected thickness on a semiconductor wafer, comprising:
   immersing said wafer in an electrolytic solution containing metal ions;
   rotating said wafer at a first rotation rate during a first plating time;
   biasing said wafer negatively with respect to said electrolytic solution to generate a DC current in said electrolytic solution;
   interrupting said biasing to generate substantially zero current during a plurality of short pauses, said interrupting being conducted during a second plating time; and
   rotating said wafer at a second rotation rate during said second plating time, said second rotation rate having a value not exceeding 50 rpm.

2. A method as in claim 1 wherein said first rotation rate is greater than said second rotation rate.

3. A method as in claim 1 wherein said interrupting during said second plating time and said rotating during said second plating time are conducted after approximately ten percent of said selected thickness of said metal layer has formed on said wafer.

4. A method as in claim 1 wherein said interrupting is conducted after approximately twenty percent of said selected thickness of said metal layer has formed on said wafer.

5. A method as in claim 1 wherein said interrupting is conducted after approximately forty percent of said selected thickness of said metal layer has formed on said wafer.

6. A method as in claim 1 wherein said interrupting is conducted after approximately sixty percent of said selected thickness of said metal layer has formed on said wafer.

7. A method as in claim 1 wherein said DC current in said electrolytic solution has a current density in a range of about from 1 Amp/cm$^2$ to 150 Amp/cm$^2$.

8. A method as in claim 1 wherein said biasing negatively comprises biasing said wafer to generate a low first DC current during said first plating time; and thereafter biasing said wafer to generate a high second DC current during said second plating time.

9. A method as in claim 1 wherein said metal comprises copper.

10. A method as in claim 9 wherein said biasing negatively comprises generating a low first DC current having a current density in a range of about from 1 mA/cm$^2$ to 8 mA/cm$^2$ during said first plating time, and generating a high second DC current having a current density in a range of about from 25 mA/cm$^2$ to 110 mA/cm$^2$ during said second plating time.

11. A method as in claim 10 wherein said biasing negatively comprises biasing said wafer to generate an intermediate DC current during an intermediate plating time between said first plating time and said second plating time.

12. A method as in claim 11 wherein said biasing negatively comprises generating an intermediate DC current having a current density in a range of about from 5 mA/cm$^2$ to 20 mA/cm$^2$ during an intermediate plating time.

13. A method as in claim 11 further comprising rotating said wafer at an intermediate rotation rate during said intermediate plating time, said intermediate rotation rate having a speed between said first rotation rate and said second rotation rate.

14. A method as in claim 1 wherein said biasing negatively comprises biasing said wafer during a total deposition time in a range of about from 5 seconds to 300 seconds.

15. A method as in claim 1 wherein said biasing negatively comprises biasing said wafer during a plurality of bias-on-times during said second plating time, each of said bias-on-times comprising a time period in a range of from 0.1 second to for 30 seconds.

16. A method as in claim 15 wherein each of said bias-on-times comprises a time period in a range of from one second to 15 seconds.

17. A method as in claim 15 wherein each of said bias-on-times comprises a time period in a range of from two seconds to 15 seconds.

18. A method as in claim 1 wherein each of said short pauses comprises a pause time in a range of about from 2 milliseconds to 5 seconds.

19. A method as in claim 1 wherein each of said pauses comprises a pause time in a range of about from 5 milliseconds to 2 seconds.

20. A method as in claim 1 wherein each of said pauses comprises a pause time in a range of about from 10 milliseconds to 500 milliseconds.

21. A method as in claim 1 wherein said plurality of short pauses comprises a number of pauses in a range of about from 2 pauses to 60 pauses.

22. A method as in claim 1 wherein said plurality of short pauses comprises a number of pauses in a range of about from 3 pauses to 15 pauses.

23. A method as in claim 1 wherein said second rotation rate does not exceed 25 rpm.

24. A method as in claim 1 wherein said second rotation rate does not exceed 10 rpm.

25. A method as in claim 1 further comprising rotating said wafer at a bias-off-time rotation rate during at least one of said pauses, wherein said bias-off-time rotation rate is greater than said second rotation rate.

26. A method as in claim 1 further characterized in that said wafer is not biased positively with respect to said electrolytic solution.

27. A metal layer deposited in accordance with the method of claim 1.

28. A method of depositing a metal layer to a selected thickness on a semiconductor wafer, comprising:
   immersing said wafer in an electrolytic solution containing metal ions;
   biasing said wafer negatively with respect to said electrolytic solution to generate a DC current in said electrolytic solution; and
   interrupting said biasing to generate substantially zero current during a plurality of short pauses.

29. A method as in claim 28 further comprising rotating said wafer.

30. A method as in claim 28 wherein said interrupting during said plurality of short pauses is conducted after approximately ten percent of said selected thickness of said metal layer has formed on said wafer.

31. A method as in claim 28 wherein said interrupting is conducted after approximately twenty percent of said selected thickness of said metal layer has formed on said wafer.

32. A method as in claim 28 wherein said interrupting is conducted after approximately forty percent of said selected thickness of said metal layer has formed on said wafer.

33. A method as in claim 28 wherein said interrupting is conducted after approximately sixty percent of said selected thickness of said metal layer has formed on said wafer.

34. A method as in claim 28 wherein said biasing negatively comprises biasing said wafer to generate a low first DC current during a first plating time; and thereafter increasing DC current to a high second DC current during a second plating time after at least approximately ten percent of said selected thickness of said metal layer has formed on said wafer.

35. A method as in claim 34 wherein said biasing negatively comprises biasing said wafer to generate an intermediate DC current during an intermediate plating time between said first plating time and said second plating time.

36. A method as in claim 28 wherein said metal comprises copper.

37. A method as in claim 28 wherein said biasing negatively comprises biasing said wafer during a total deposition time comprising a time period in a range of about from 5 seconds to 300 seconds, and wherein said biasing negatively comprises biasing said wafer to generate a DC current having a current density in a range of about from 1 Amp/cm$^2$ to 150 Amp/cm$^2$.

38. A method as in claim 28 wherein said biasing negatively comprises biasing said wafer during a plurality of bias-on-times during said second plating time, each of said bias-on-times comprising a time period in a range of from 0.1 second to for 30 seconds.

39. A method as in claim 38 wherein each of said bias-on-times comprises a time period in a range of from one second to 15 seconds.

40. A method as in claim 38 wherein each of said bias-on-times comprises a time period in a range of from two seconds to 15 seconds.

41. A method as in claim 28 wherein each of said short pauses comprises a pause time in a range of about from 2 milliseconds to 5 seconds.

42. A method as in claim 28 wherein each of said pauses comprises a pause time in a range of about from 5 milliseconds to 2 seconds.

43. A method as in claim 28 wherein each of said pauses comprises a pause time in a range of about from 10 milliseconds to 500 milliseconds.

44. A method as in claim 28 wherein said plurality of short pauses comprises a number of pauses in a range of about from 2 pauses to 100 pauses.

45. A method as in claim 28 wherein said plurality of short pauses comprises a number of pauses in a range of about from 3 pauses to 15 pauses.

46. A metal layer deposited in accordance with the method of claim 28.

47. A method of depositing a metal layer to a selected thickness on a semiconductor wafer, comprising:

immersing said wafer in an electrolytic solution containing metal ions;

biasing said wafer negatively with respect to said electrolytic solution to generate a DC current in said electrolytic solution;

rotating said wafer in said electrolytic solution at a first rotation rate during a first plating time; and thereafter rotating said wafer at a second rotation rate during a second plating time, said second rotation rate being less than said first rotation rate.

48. A method as in claim 47 wherein said second rotation rate does not exceed 50 rpm.

49. A method as in claim 47 wherein said rotating said wafer at said second rotation rate during said second plating time is conducted after approximately ten percent of said selected thickness of said metal layer has formed on said wafer.

50. A method as in claim 47 wherein said rotating at said second rotation rate is conducted after approximately twenty percent of said selected thickness of said metal layer has formed on said wafer.

51. A method as in claim 47 wherein said rotating at said second rotation rate is conducted after approximately forty percent of said selected thickness of said metal layer has formed on said wafer.

52. A method as in claim 47 wherein said rotating at said second rotation rate is conducted after approximately sixty percent of said selected thickness of said metal layer has formed on said wafer.

53. A method as in claim 47 wherein said biasing negatively comprises biasing said wafer to generate a low first DC current during said first plating time; and thereafter increasing DC current to a high second DC current during said second plating time after at least approximately ten percent of said selected thickness of said metal layer has formed on said wafer.

54. A method as in claim 53 wherein said biasing negatively comprises biasing said wafer to generate an intermediate DC current during an intermediate plating time between said first plating time and said second plating time.

55. A method as in claim 47 wherein said metal comprises copper.

56. A method as in claim 47 wherein said biasing negatively comprises biasing said wafer during a total deposition time comprising a time period in a range of about from 5 seconds to 300 seconds, and wherein said biasing negatively comprises biasing said wafer to generate a DC current having a current density in a range of about from 1 Amp/cm$^2$ to 150 Amp/cm$^2$.

57. A metal layer deposited in accordance with the method of claim 47.

* * * * *